(12) United States Patent
Hsu et al.

(10) Patent No.: US 7,335,941 B2
(45) Date of Patent: Feb. 26, 2008

(54) UNIFORM CHANNEL PROGRAMMABLE ERASABLE FLASH EEPROM

(75) Inventors: Te-Hsun Hsu, Hsinchu (TW); Hung-Cheng Sung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 40 days.

(21) Appl. No.: 10/890,673

(22) Filed: Jul. 14, 2004

(65) Prior Publication Data

US 2006/0014345 A1    Jan. 19, 2006

(51) Int. Cl.
*H01L 29/792* (2006.01)

(52) U.S. Cl. ...................... 257/324; 257/325

(58) Field of Classification Search ................ 257/314, 257/315, 324, 325, 326; 438/257
See application file for complete search history.

(56) References Cited

U.S. PATENT DOCUMENTS

| | | | | |
|---|---|---|---|---|
| 3,911,464 A * | 10/1975 | Chang et al. | ........... | 365/185.26 |
| 4,253,106 A * | 2/1981 | Goldsmith et al. | ......... | 257/316 |
| 5,019,879 A * | 5/1991 | Chiu | ........................... | 257/321 |
| 5,021,848 A * | 6/1991 | Chiu | ........................... | 257/317 |
| 5,508,543 A * | 4/1996 | Hartstein et al. | ........... | 257/314 |
| 5,614,747 A * | 3/1997 | Ahn et al. | .................... | 257/316 |
| 5,714,412 A * | 2/1998 | Liang et al. | ................. | 438/266 |
| 5,729,035 A * | 3/1998 | Anma | ........................ | 257/324 |
| 5,780,341 A * | 7/1998 | Ogura | ........................ | 438/259 |
| 5,841,162 A * | 11/1998 | Enomoto | .................... | 257/315 |
| 5,841,700 A | 11/1998 | Chang | | |
| 5,877,523 A * | 3/1999 | Liang et al. | ................. | 257/315 |
| 6,037,627 A * | 3/2000 | Kitamura et al. | ........... | 257/324 |
| 6,166,958 A * | 12/2000 | Naruke et al. | ......... | 365/185.24 |
| 6,184,093 B1 * | 2/2001 | Sung | ........................... | 438/275 |
| 6,284,596 B1 | 9/2001 | Sung et al. | | |
| 6,313,500 B1 * | 11/2001 | Kelley et al. | ............... | 257/316 |
| 6,323,085 B1 | 11/2001 | Sandhu et al. | | |
| 6,437,396 B1 * | 8/2002 | Chou | ......................... | 257/316 |
| 6,444,545 B1 | 9/2002 | Sadd et al. | | |
| 6,538,276 B2 * | 3/2003 | Hsieh et al. | ................ | 257/316 |
| 6,538,277 B2 | 3/2003 | Sung et al. | | |
| 6,562,673 B2 * | 5/2003 | Lin | ............................ | 438/211 |
| 6,614,072 B2 | 9/2003 | Sandhu et al. | | |
| 6,667,508 B2 * | 12/2003 | Lin et al. | ..................... | 257/315 |
| 6,762,068 B1 * | 7/2004 | Forbes et al. | ................. | 438/16 |
| 6,774,429 B2 * | 8/2004 | Arai | ........................... | 257/316 |
| 6,812,519 B2 * | 11/2004 | Furuhata | ..................... | 257/316 |
| 6,828,183 B1 * | 12/2004 | Sung et al. | ................. | 438/201 |

(Continued)

*Primary Examiner*—Thao P. Le
(74) *Attorney, Agent, or Firm*—Slater & Matsil, L.L.P.

(57) ABSTRACT

A new method to form a split gate for a flash device in the manufacture of an integrated circuit device is achieved. The method comprises providing a substrate. A film is deposited overlying the substrate. The film comprises a second dielectric layer overlying a first dielectric layer with an electronic-trapping layer therebetween. A masking layer is deposited overlying the film. The masking layer and the film are patterned to expose a part of the substrate and to form a floating gate electrode comprising the electronic-trapping layer. An oxide layer is grown overlying the exposed part of the substrate. The masking layer is removed. A conductive layer is deposited overlying the oxide layer and the second dielectric layer. The conductive layer and the oxide layer are patterned to complete a control gate electrode comprising the conductive layer. The control gate electrode has a first part overlying the floating gate electrode and a second part not overlying the floating gate electrode.

20 Claims, 9 Drawing Sheets

U.S. PATENT DOCUMENTS

| | | | |
|---|---|---|---|
| 6,838,343 B2* | 1/2005 | Hung et al. | 438/257 |
| 6,943,404 B2* | 9/2005 | Huang et al. | 257/324 |
| 6,969,885 B2* | 11/2005 | Omi et al. | 257/324 |
| 7,009,242 B2* | 3/2006 | Nagai | 257/315 |
| 2002/0008222 A1* | 1/2002 | Maurelli | 251/314 |
| 2003/0211689 A1* | 11/2003 | Yoo et al. | 438/257 |
| 2004/0227180 A1* | 11/2004 | Huang et al. | 257/324 |
| 2004/0262672 A1* | 12/2004 | Chang | 257/324 |
| 2005/0054167 A1* | 3/2005 | Choi et al. | 438/287 |
| 2005/0116281 A1* | 6/2005 | Yang et al. | 257/324 |
| 2005/0247972 A1* | 11/2005 | Forbes | 257/324 |
| 2006/0138530 A1* | 6/2006 | Kang et al. | 257/326 |

* cited by examiner

UNIFORM CHANNEL PROGRAMMABLE ERASABLE FLASH EEPROM

TECHNICAL FIELD

The invention relates generally to a method of manufacturing an integrated circuit device and, more particularly, to a method of fabricating a split gate memory cell.

BACKGROUND

Electrically erasable and electrically programmable read-only memories (EEPROMS) are widely used in the art of integrated circuits. Flash memories are a particular form of EEPROMS that can be quickly erased. Generally, flash EEPROM cells may be formed as stacked gates or as split gates. Referring now to FIG. 18, a prior art stack gate, a flash EEPROM device 225, is shown in simplified form. The device comprises an MOS transistor having a substrate or bulk 200, a source and drain 204, and a complex gate 208, 212, 216, and 220. The gate comprises a control gate electrode 220 and a floating gate electrode 212. The floating gate electrode 212 is a conductive film that is separated from the substrate 200 by a tunnel oxide 208 and that is separated from the control gate electrode 220 by an inter-gate dielectric 216.

The memory device 225 is essentially an MOSFET having a variable threshold voltage (Vth). As in any MOSFET, the charge carrier conductivity of the channel region 206 between the source and drain regions 204 is controlled by a voltage on the gate 220, 216, 212, and 208. In the flash device case, voltages are applied to the control gate electrode 220 while the floating gate electrode 212 is isolated. If the control gate electrode 220 voltage exceeds the Vth of the device 225, then current will be conducted from drain 204 to source 204 under a drain to source bias. If the Vth exceeds the control gate electrode 220 bias, then the drain to source current will be shut OFF. In this way, the relative Vth of the flash device can be read. In a memory scheme, the variable Vth is programmed to represent a memory state, such as '0' or '1'.

A quantity of charge can be stored on the floating gate electrode 212. It is the presence of this charge that alters the Vth of the device 225. For example, if a p-type substrate 200 is used, then the memory device 225 would be an NMOS type flash device 225 is formed. To conduct current from drain to source 204, the p-type substrate 200 must be inverted at the substrate channel 206. Note that the stack of control gate 220 and floating gate 212 overlying the channel region 206 creates a capacitor divider. Therefore, any voltage applied to the control gate electrode 220 is divided according to the coupling ratios between the control and floating gates and between the floating gate and substrate. A sufficiently large positive voltage bias on the control gate 220 will cause an accumulation of negative carriers (electrons) at the substrate 200 surface in the channel region 206 as is typical in an NMOS device. If a negative charge is stored on the floating gate electrode 212, then the value of the positive voltage on the control gate electrode 220 necessary to invert the channel must be increased to compensate.

The device 225 is erased by biasing the control gate electrode 220, drain 204, source 204, and substrate 200 such that electrons are injected from the drain 204, source 204, or substrate 200 through the tunnel oxide layer 208 and onto the floating gate electrode 212. This negative charge on the floating gate electrode 212 will raise the Vth of the device 225 by several volts. The device 225 is programmed by biasing the control gate electrode 220, drain 204, source 204, and substrate 200 such that electrons are removed from the floating gate electrode 212 through the tunnel oxide layer 208 and into the substrate 200.

To ensure a complete erasing of all the cells in the erasing block during the erasing process, the erasing bias conditions are normally sustained for a prolonged period of time. There are occasions when this prolonged erasing operation results in the removal of excessive electrons from the floating gate electrode 212 such that the floating gate is positively charged. In a memory device 225 that has been severely over-erased, the floating gate 212 charge condition causes the device to operate as a depletion device. That is, the memory device 225 conducts drain-to-source current even when the control gate electrode 220 has a zero bias or is floating. This is called over erasure.

To overcome over erasure, split gate flash memory devices have been constructed in the art. In a split gate device, the stacked gate, comprising a control gate overlying a floating gate, is present over only a part of the channel region of the device between source and drain. In another part of the channel region, the control gate electrode overlies the substrate without an intervening floating gate. In this way, the floating gate can be used to alter the Vth of the device, yet, the control gate can turn OFF the channel even if the floating gate is over-erased.

SUMMARY OF THE INVENTION

These and other problems are generally solved or circumvented, and technical advantages are generally achieved, by preferred embodiments of the present invention which provides an effective and manufacturable flash EEPROM device.

A further object of the present invention is to provide a flash device with improved over-erase performance.

A yet further object of the present invention is to improve over-erase performance by forming a split gate structure.

A yet further object of the present invention is to provide a method to form a split gate flash device.

In accordance with the objects of this invention, a method to form a split gate for a flash device in the manufacture of an integrated circuit device is achieved. The method comprises providing a substrate. A film is deposited overlying the substrate. The film comprises a second dielectric layer overlying a first dielectric layer with an electronic-trapping layer therebetween. A masking layer is deposited overlying the film. The masking layer and the film are patterned to expose a part of the substrate and to form an electronic-trapping region, e.g., a floating gate electrode, comprising the electronic-trapping layer. An oxide layer is grown overlying the exposed part of the substrate. The masking layer is removed. A conductive layer is deposited overlying the oxide layer and the second dielectric layer. The conductive layer and the oxide layer are patterned to complete a control gate electrode comprising the conductive layer. The control gate electrode has a first part overlying the electronic-trapping region and a second part not overlying the electronic-trapping region.

Also in accordance with the objects of this invention, a split gate for a flash device is achieved. The device comprises a substrate. An electronic-trapping region, e.g., a floating gate electrode, comprises an electronic-trapping layer overlying the substrate with a first dielectric layer therebetween. A control gate electrode comprises a conductive layer. A first part of the control gate overlies the electronic-trapping region with a second dielectric layer therebetween. A second part of the control gate does not overlie the electronic-trapping region but does overlie the substrate with an oxide layer therebetween.

Also in accordance with the objects of this invention, a method to form a split gate for a flash device in the manufacture of an integrated circuit device is achieved. The method comprises providing a substrate. A film is deposited overlying the substrate. The film comprises a polysilicon layer overlying a first dielectric layer. A masking layer is deposited overlying the film. The masking layer and the film are patterned to form an electronic-trapping region comprising the polysilicon layer. A part of the polysilicon layer is oxidized. The masking layer is removed. A second dielectric layer is formed overlying the electronic-trapping region and the substrate. A conductive layer is deposited overlying the second dielectric layer. The conductive layer and the second dielectric layer are patterned to complete a control gate electrode comprising the conductive layer. The control gate electrode has a first part overlying the electronic-trapping region and a second part not overlying the electronic-trapping region.

Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The preferred embodiments of the present invention disclose methods to form flash memory devices. In addition, unique flash memory device structures are described. It should be clear to those experienced in the art that the present invention can be applied and extended without deviating from the scope of the present invention.

Referring now to FIGS. 1 through 10, a first preferred embodiment of the present invention is illustrated. Several features of the present invention are shown and discussed below. In this embodiment, a method to form a split gate flash EEPROM device is described. In addition, a split gate flash EEPROM device is described.

Figure 1:
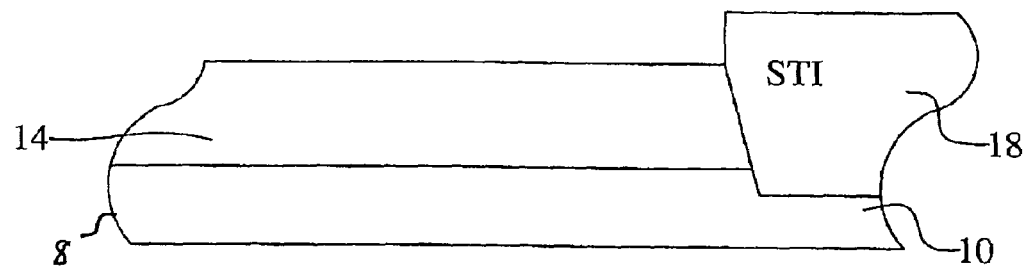
FIGS. 1 through 10 illustrate a first preferred embodiment of the present invention.

Referring particularly to FIG. 1, a substrate 8 is provided. The substrate 8 preferably comprises a semiconductor material and, more preferably, comprises silicon. If a semiconductor material is used for the substrate 8, then it is further preferred that this semiconductor material be doped with impurity ions to form a type (n or p) and a concentration for the bulk terminal of the device as will described below.

Because a plurality of devices are typically formed in a flash EEPROM array, provision is preferably made to isolate the devices one from another. Therefore, the substrate 8 is divided into active regions through the use of isolation structures 18. For example, shallow trench isolation (STI) 18 structures are preferably formed in the substrate 8 to isolate device active areas. The STI regions 18 may be formed by, for example, etching trenches into the substrate 8, filling these trenches with a dielectric material 18, and then planarizing the wafer surface to remove excess dielectric material 18. After the STI regions 18 are formed, the substrate 8 may be further prepared by forming doped wells. For example, in an embodiment, the substrate 8 may comprise wells 10 and 14 of differing types, such as a deep n-well formed underlying a p-well by successive ion implantation steps.

Figure 2:
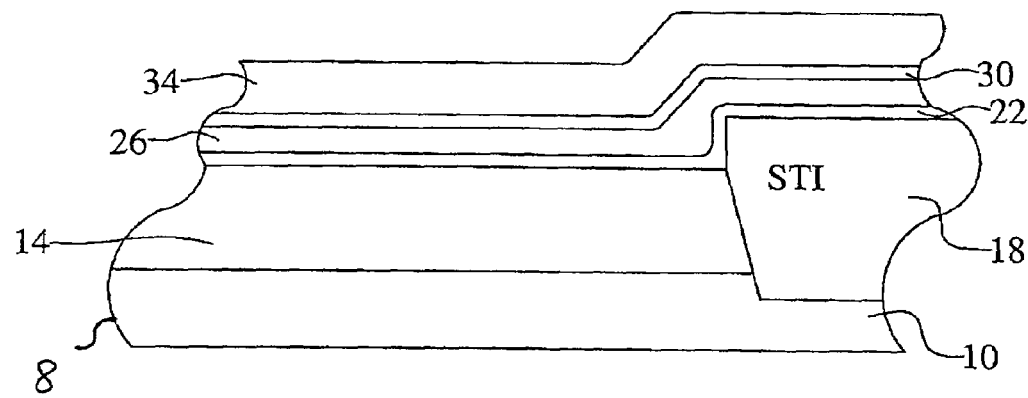

As illustrated in FIG. 2, a film 22, 26, and 30 is next formed overlying the substrate 8. The film comprises a second dielectric layer 30 overlying a first dielectric layer 22 with an electronic-trapping layer 26 therebetween. The first dielectric layer 22 preferably comprises an oxide, such as silicon oxide. The first dielectric layer 22 may be formed by chemical vapor deposition (CVD) or by oxidation of the substrate 8. Preferably, the first dielectric layer 22 is deposited to a thickness of between about 10 Å and about 100 Å. The electronic-trapping layer 26 may comprise, for example, silicon nitride formed by CVD and is preferably deposited to a thickness of between about 20 Å and about 300 Å. Silicon nanoclusters (also referred to as silicon dots) may also be used as described in U.S. Pat. No. 6,444,545 B1.

The second dielectric layer 30 may be formed by chemical vapor deposition (CVD). Preferably, the second dielectric layer 30 is deposited to a thickness of between about 20 Å and about 500 Å. Most preferably, the first dielectric layer 22, electronic-trapping layer 26, and second dielectric layer 30 are deposited by successive CVD processes as an oxide-nitride-oxide (ONO) film. A masking layer 34 is next deposited overlying the film 22, 26, and 30. The masking layer 34 preferably comprises a silicon nitride layer. The masking layer 34 is preferably deposited by CVD to a thickness of between about 500 Å and about 3,000 Å.

Figure 3:
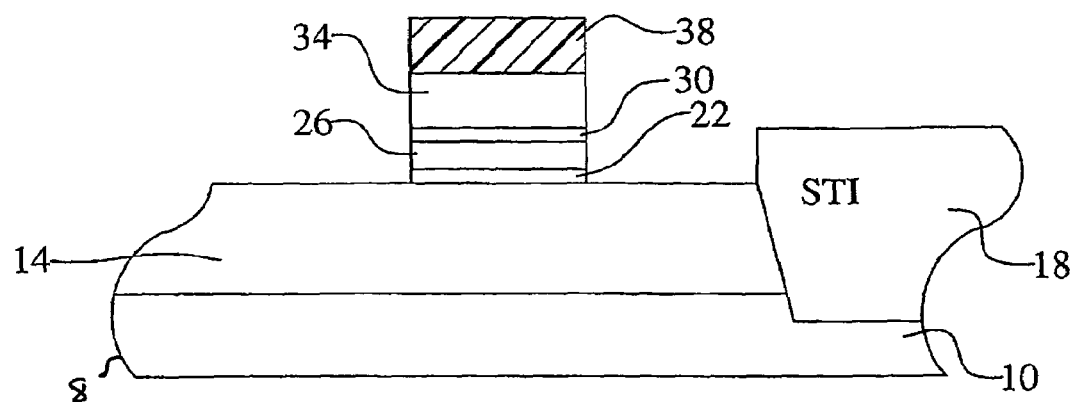

Referring now to FIG. 3, another feature of an embodiment of the present invention is illustrated. The masking layer 34 and the film 22, 26, and 30, are patterned to expose a part of the substrate 8 and to form an electronic-trapping region, e.g., a floating gate electrode, comprising the electronic-trapping layer 26. This patterning may be performed by, for example, depositing a photoresist layer 38 overlying the masking layer 34, exposing the photoresist layer 38 to actinic light through a mask and developing the photoresist layer 38. The photoresist layer 38 can then be used to mask the etching of the masking layer 34 and the film 22, 26, and 30.

Figure 4:
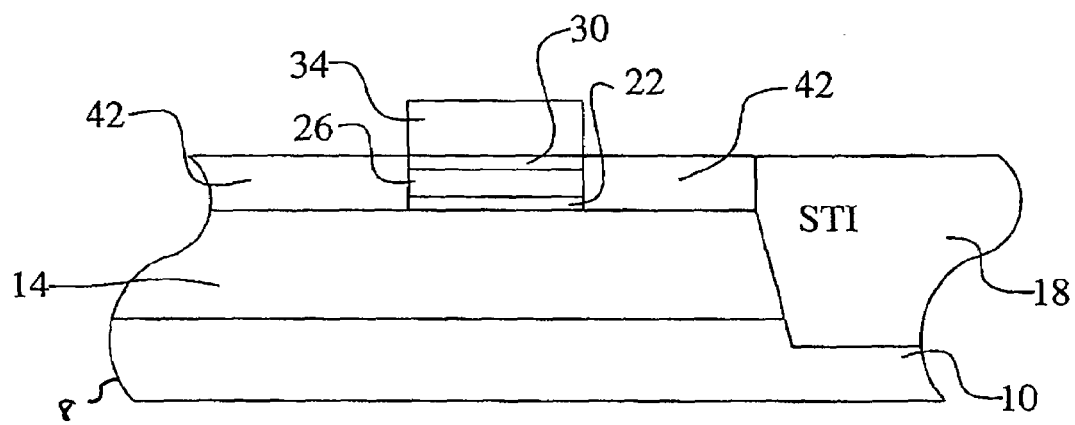

Referring now to FIG. 4, another feature of an embodiment of the present invention is illustrated. An oxide layer 42 is grown overlying the exposed part of the substrate 8. Note that the oxide layer 42 is prevented from growing on the substrate 8 under the patterned masking layer 34 and film stack 22, 26, and 30. The oxide layer 42 preferably comprises silicon oxide that is thermally grown over the substrate 8 to a thickness of between about 20 Å and about 300 Å.

Figure 5:
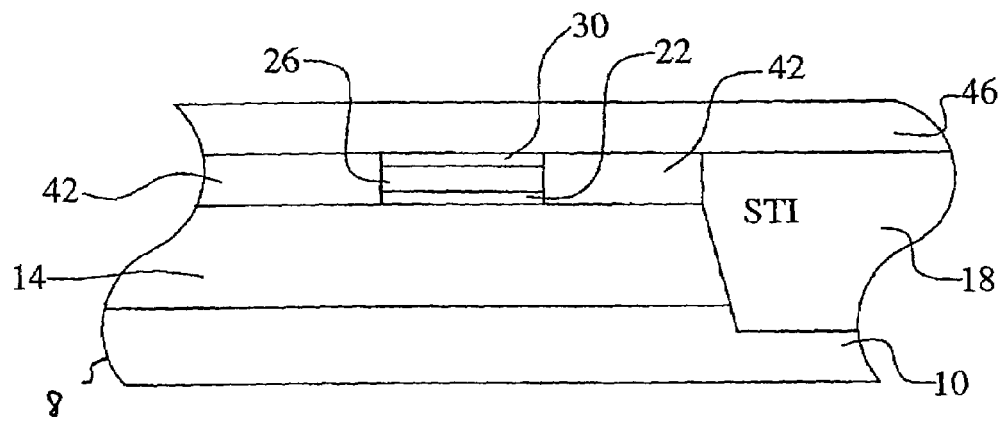

Referring now to FIG. 5, the masking layer 34 is removed, and a conductive layer 46 is deposited overlying the oxide layer 42 and the second dielectric layer 30. The conductive layer 46 preferably comprises polysilicon that may be doped or undoped. Preferably, the polysilicon is deposited by a CVD process to a thickness of between about 500 Å and about 3,000 Å.

Figure 6:
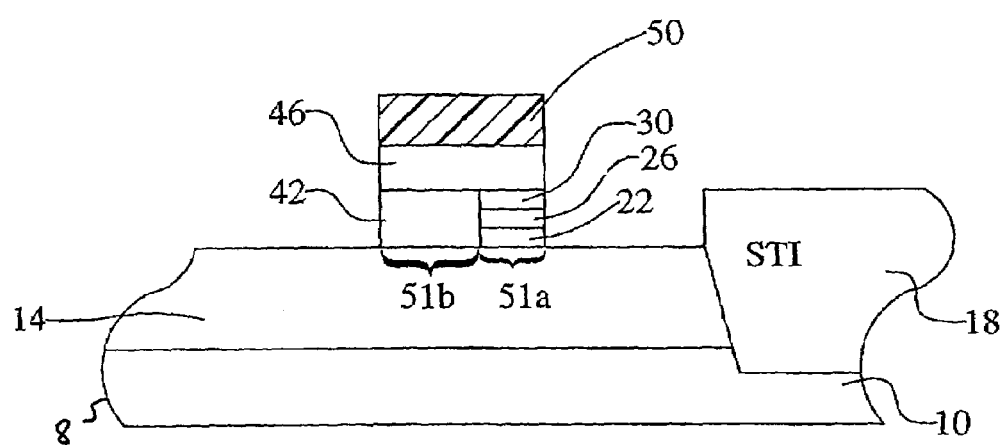

Referring now to FIG. 6, the conductive layer 46 and the oxide layer 42 are patterned to complete a control gate electrode comprising the conductive layer 46. The control gate electrode 46 has a first part 51a overlying the electronic-trapping region 26 and a second part 51b not overlying the electronic-trapping region 26. In this way, a split gate is formed where the control gate 46 controls the transistor channel directly in the second part 51b and controls the channel through the electronic-trapping region 26 in the first part 51a. Note also that the patterning step may further comprise etching through the floating gate 26 where exposed by the photomask 50. The photomask 50 may be formed by the process as previously described above.

Figure 7:
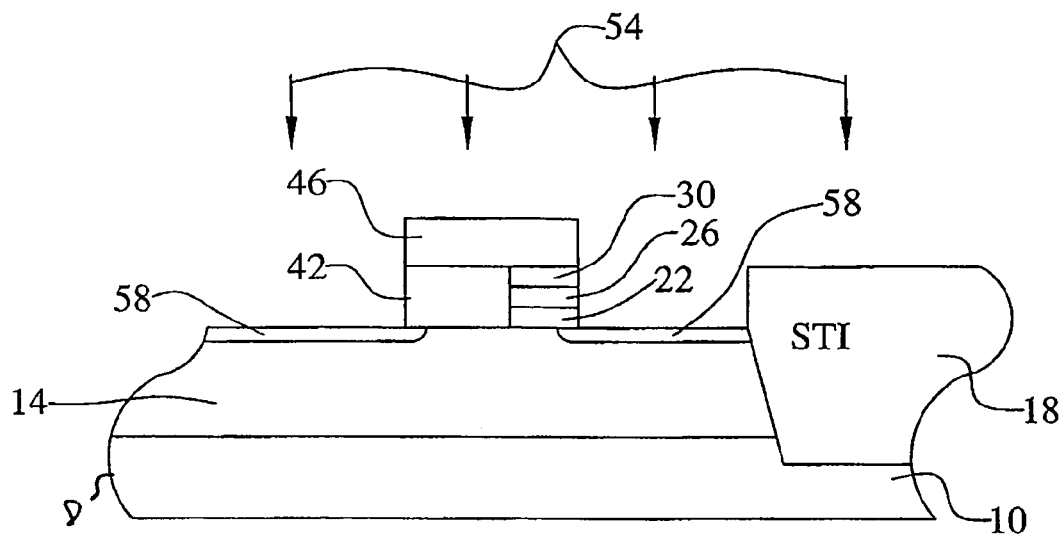

Referring now to FIG. 7, lightly doped drain (LDD) regions 58 are formed in the substrate 8. Preferably, ions are implanted 54 into the substrate 8 to form the LDD regions 58 of opposite type to the substrate 8 in the channel region. In the exemplary case, the upper well 14 is a p-well and the LDD regions 58 are n-type.

Figure 8:
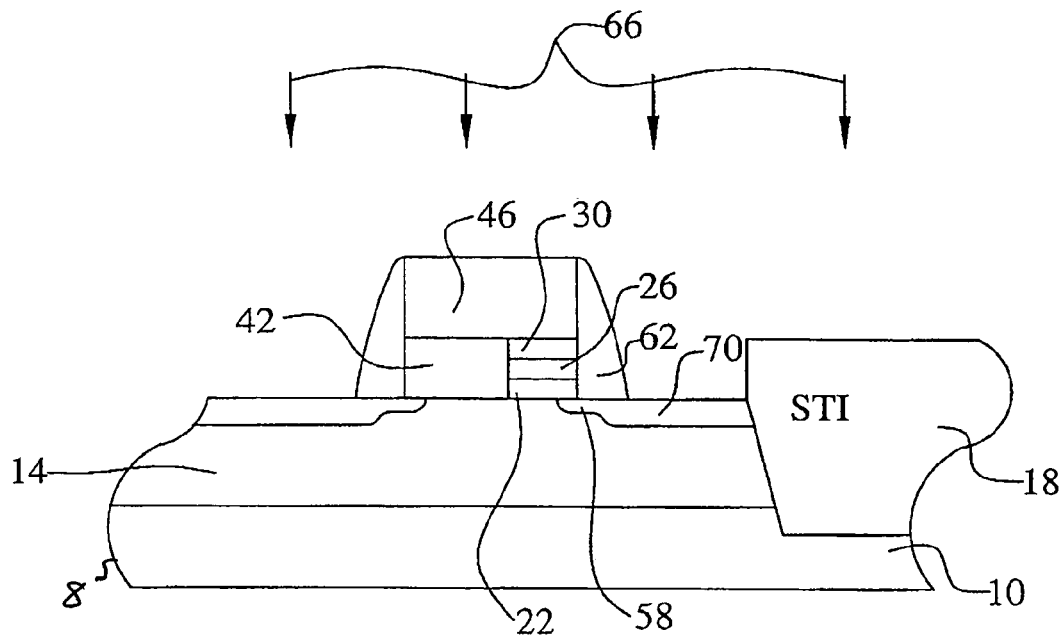

Referring now to FIG. 8, spacers 62 are formed on the sidewalls of the control gate electrode 46 and the electronic-trapping region 26. The spacers 62 preferably comprise a dielectric layer such as oxide. The spacers 62 can be formed, for example, by depositing a dielectric layer overlying the control gate electrode 46 and the substrate 8 and then anisotropically etching back the dielectric layer to leave spacers 62 on the sidewalls. Source/drain regions 70 are formed in the substrate 8 adjacent to the spacers 62. Ions are implanted 66 into the substrate 8 to form the source/drain regions 70. In the preferred case, the source/drain regions 70 comprise n+.

Figure 9:
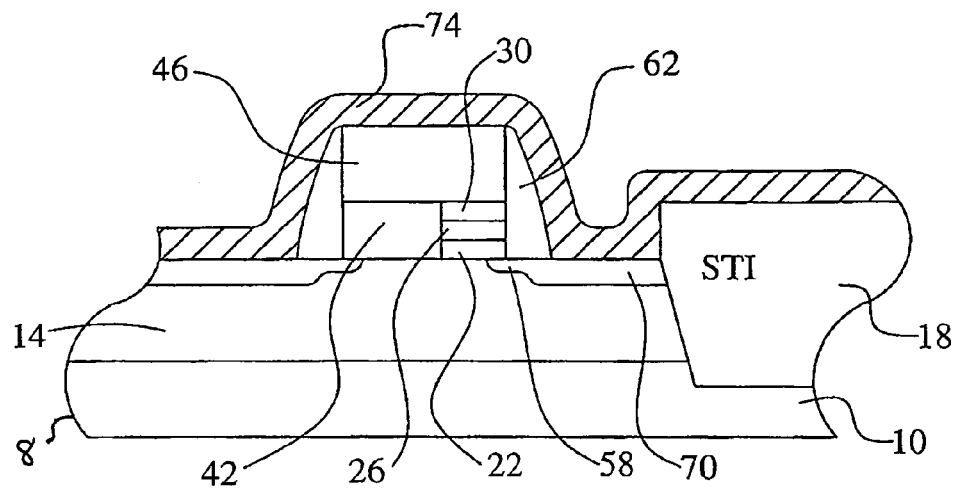
Figure 10:
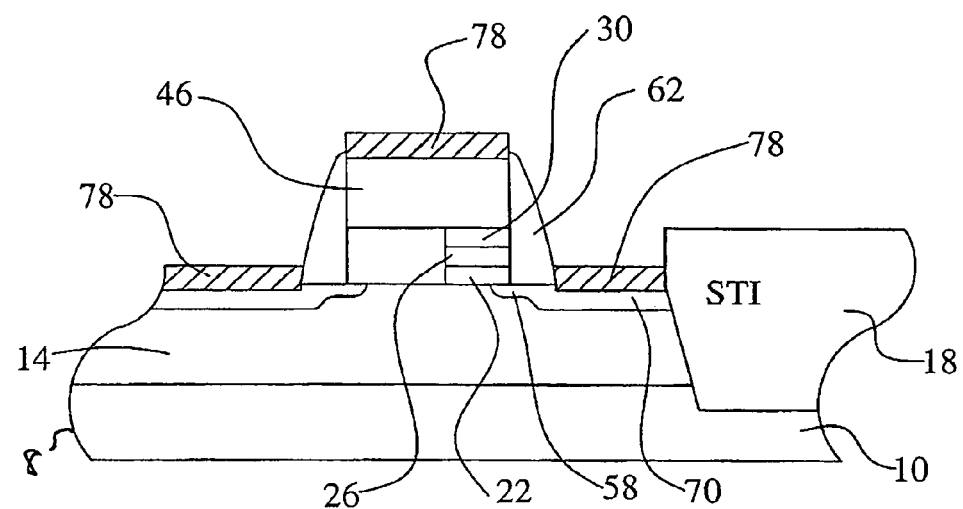
Figure 11:
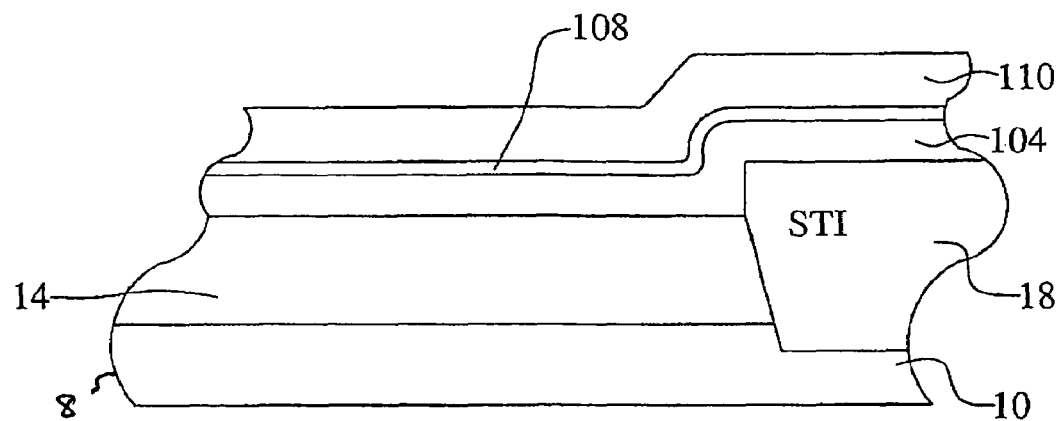
FIGS. 11 through 17 illustrate a second preferred embodiment of the present invention.

Referring now to FIGS. 9 and 10, self-aligned metal silicide regions 78 are formed on the source/drain 70 and control gate electrode 46 regions. Referring in particular to FIG. 9, a metal layer 74 is deposited overlying the source/drain regions 70, the control gate electrode 46, and the spacers 62. Preferably, the metal layer 74 comprises a metal such as nickel or cobalt that will react with the silicon of the substrate 8 to form metal silicide 78. Referring again to FIG. 10, the unreacted metal is removed to leave the metal silicide regions 78 only overlying the control gate electrode 46 and the source/drain regions 70 since the metal layer 74 does not react with spacers 62.

Referring now to FIGS. 11-17, a second preferred embodiment of the present invention is illustrated. A substrate 8 is provided as in the first preferred embodiment. A film 104 and 108 is deposited overlying the substrate 8. The film comprises an electronic-trapping layer 108 overlying a first dielectric layer 104. The first dielectric layer 104 preferably comprises oxide, such as silicon oxide. The first dielectric layer 104 may be formed by chemical vapor deposition (CVD) or by oxidation of the substrate 8. Preferably, the first dielectric layer 104 is formed to a thickness of between about 10 Å and about 100 Å. The electronic-trapping layer 108 may be doped or undoped. The electronic-trapping layer 108 may be polysilicon formed by chemical vapor deposition (CVD) to a thickness of between about 100 Å and about 2,000 Å. The electronic-trapping layer 108 may, for example, also be formed of silicon nitride, silicon nanoclusters, or the like.

A masking layer 110 is deposited overlying the film 104 and 108. The masking layer 110 preferably comprises a silicon nitride layer. The masking layer 110 is preferably deposited by CVD to a thickness of between about 20 Å and about 2,000 Å.

Figure 12:
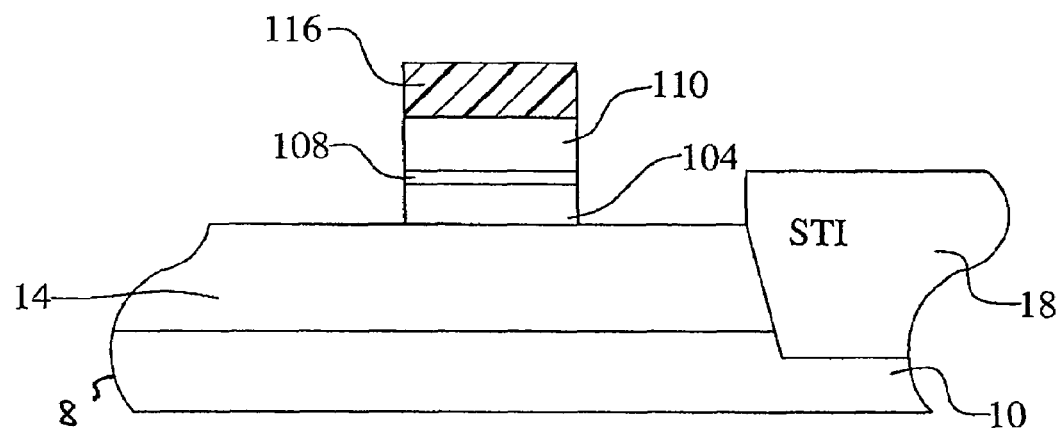

Referring to FIG. 12, the masking layer 110 and the film 104 and 108 are patterned to form an electronic-trapping region, e.g., a floating gate electrode, comprising the electronic-trapping layer 108. The patterning may use a photoresist layer 116 as described above. After the patterning step, the photoresist layer 116 is stripped away, and a part of the electronic-trapping layer 108 is oxidized by a thermal oxidation step. Accordingly, the electronic-trapping layer 108 and the first dielectric layer 104 are coextensive along an axis parallel to the direction of current flow. The direction of current flow between the source and drain is further illustrated in FIGS. 15-17.

Figure 13:
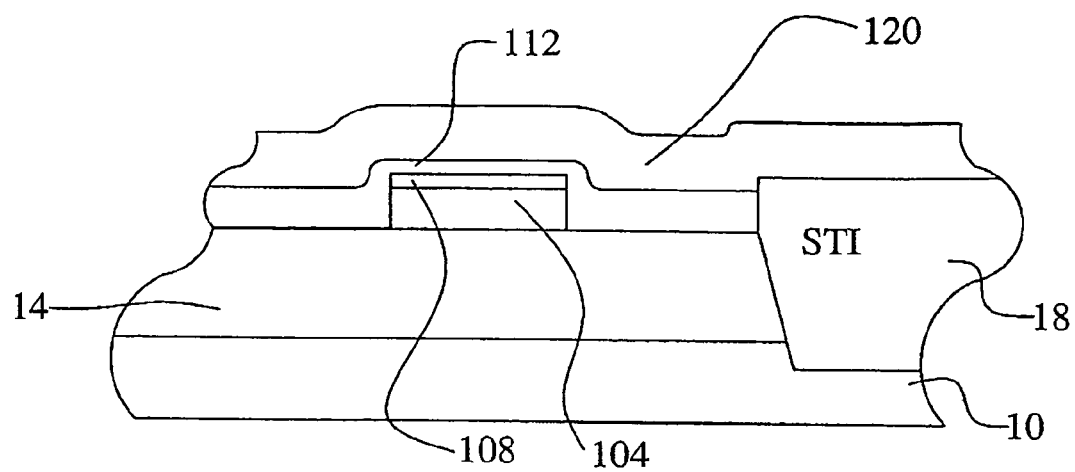

Referring now to FIG. 13, other features are shown. The masking layer 110 is removed. A second dielectric layer 112 is formed overlying the electronic-trapping layer 108 and the substrate 8. Preferably, the second dielectric layer 112 comprises oxide and, more preferably, oxide deposited by high temperature oxidation. The second dielectric layer 112 is preferably deposited to a thickness of between about 20 Å and about 300 Å. A conductive layer 120 is then deposited overlying the second dielectric layer 112. The conductive layer 120 preferably comprises polysilicon that may be doped or undoped. Preferably, the polysilicon 120 is deposited by a CVD process to a thickness of between about 500 Å and about 3,000 Å.

Figure 14:
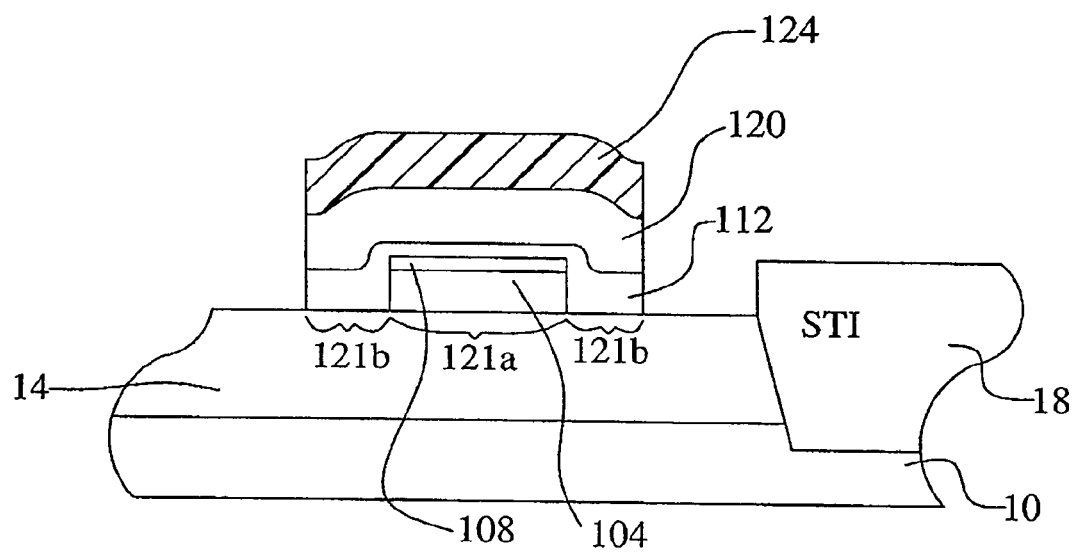

Referring now to FIG. 14, the conductive layer 120 and the second dielectric layer 112 are patterned to complete a control gate electrode comprising the conductive layer 120. The resulting control gate electrode 120 has a first part 121a overlying the electronic-trapping region 108 and a second part 121b not overlying the electronic-trapping region 108. In this way a split gate flash EEPROM device is formed. The patterning may be performed using a photoresist layer 124 as described above. As one of ordinary skill in the art will appreciate, in an embodiment of the present invention the control gate electrode 120 comprises a single continuous layer.

Figure 15:
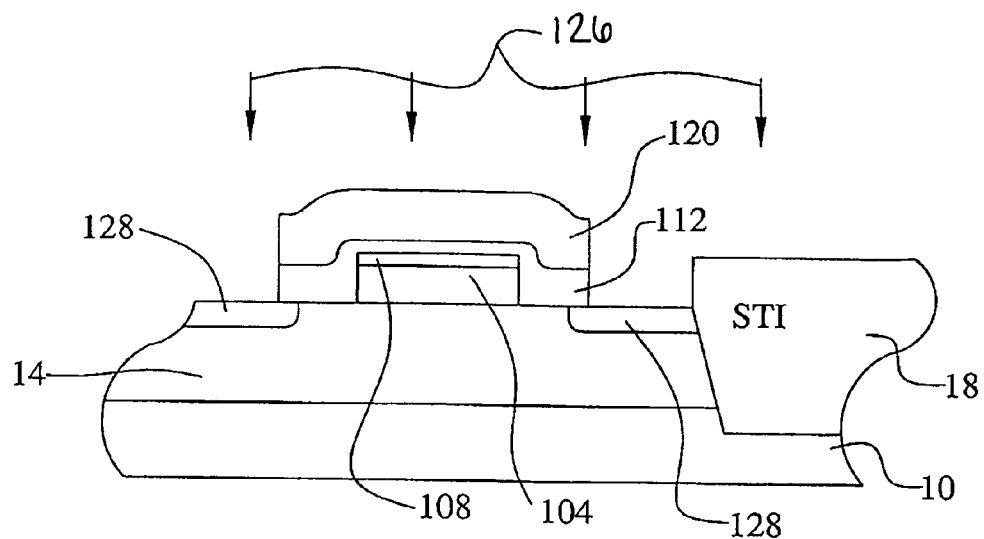

Referring now to FIG. 15, lightly doped drain (LDD) regions 128 are formed in the substrate 8. Preferably, ions are implanted 126 into the substrate 8 to form the LDD regions 128 of opposite type of the substrate 8 in the channel region. In an exemplary case, the upper well 14 is a p-well and the LDD regions 128 are n-type.

Figure 16:
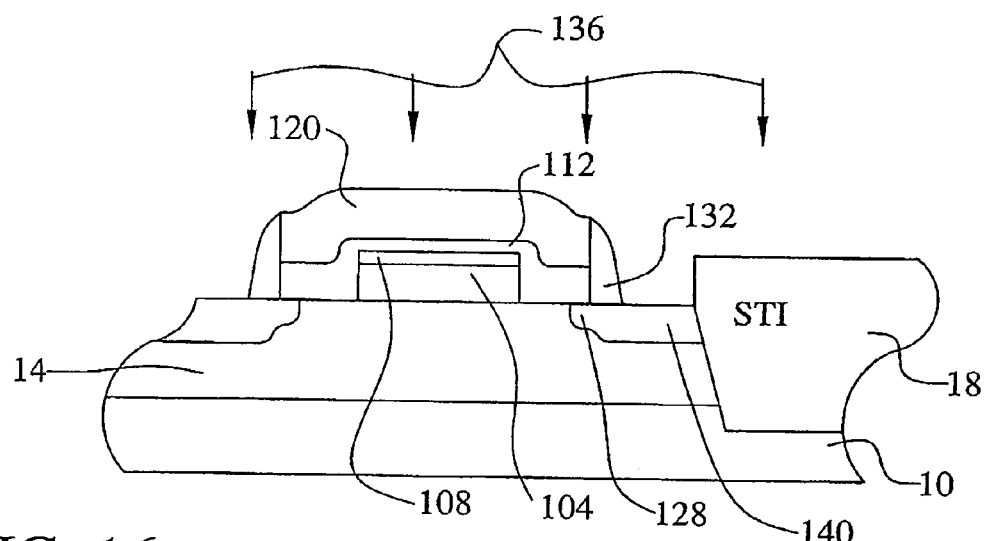

Referring now to FIG. 16, spacers 132 are formed on the sidewalls of the control gate electrode 120. The spacers 132 preferably comprise a dielectric layer such as oxide. The spacers 132 can be formed, for example, by depositing a dielectric layer overlying the control gate electrode 120 and the substrate 8 and then anisotropically etching back the dielectric layer to leave spacers 132 on the sidewalls. Source/drain regions 140 are formed in the substrate 8 adjacent to the spacers 132. Ions are implanted 136 into the substrate 8 to form the source/drain regions 140. In the preferred case, the source/drain regions 140 comprise n+.

Figure 17:
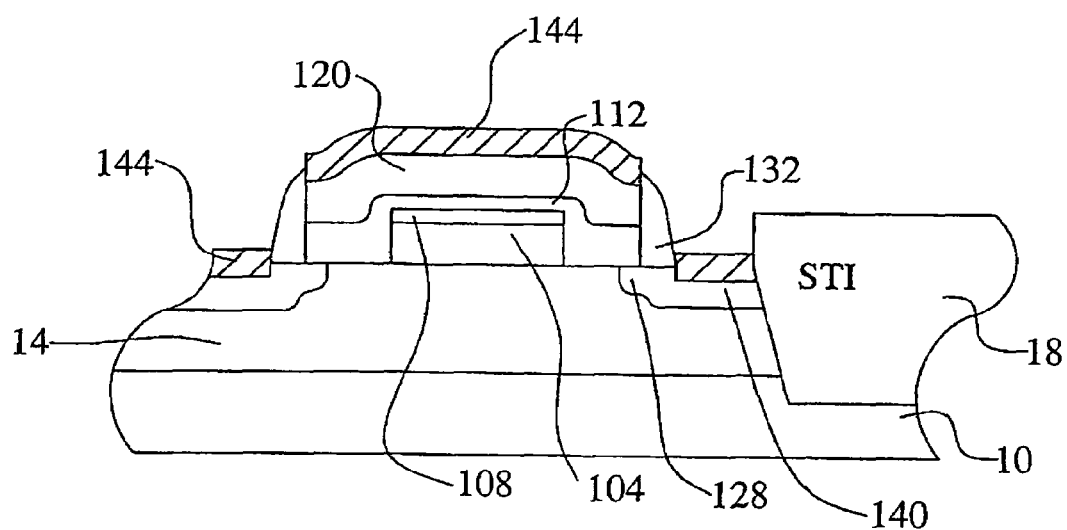
Figure 18:
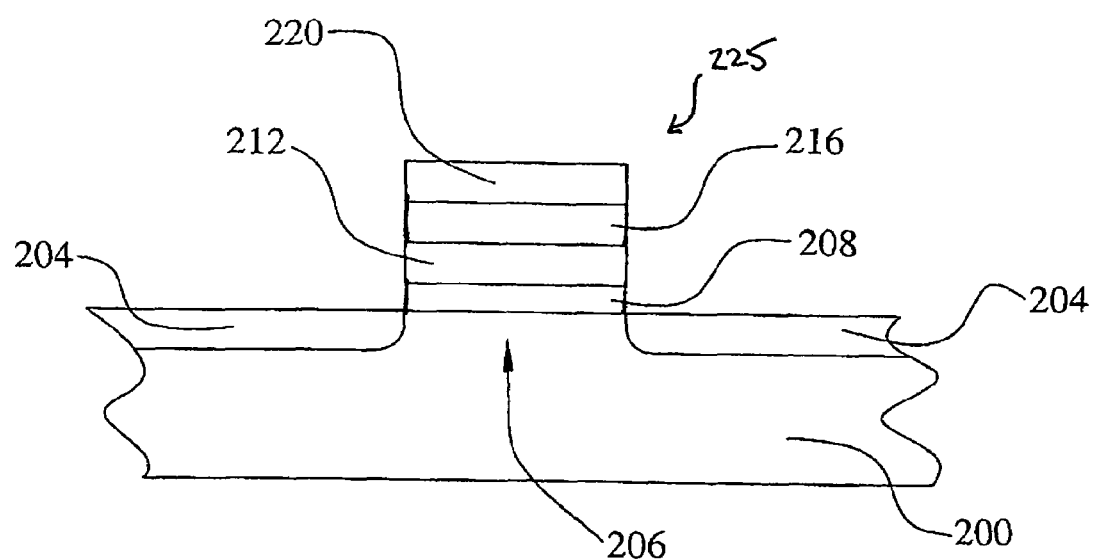
FIG. 18 illustrates a prior art flash EEPROM device.

Referring now to FIG. 17, self-aligned metal silicide regions 144 are formed on the source/drain 140 and control gate electrode 120 regions using the metal deposit and anneal technique described above.

The advantages of the present invention may now be summarized. An effective and very manufacturable flash EEPROM device is provided. The flash device has improved over-erase performance due to a split gate structure.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

What is claimed is:

1. A split gate for a flash device comprising:
    a substrate;
    an electronic-trapping region comprising an electronic-trapping layer overlying said substrate with a first dielectric layer therebetween;
    a control gate region comprising a conductive layer, a first part comprising a first end of the control gate region and a second part comprising a second end of the control gate region, the first end being an opposing end from the second end along an axis substantially parallel to a major surface of the substrate, wherein the first part completely overlies said electronic-trapping region with a second dielectric layer therebetween and wherein the second part does not overlie said electronic-trapping region but does overlie said substrate with an oxygen-containing layer therebetween, wherein the oxygen-containing layer has a thickness at least as great as a sum of a thickness of the first dielectric layer and the electronic-trapping region; and
    spacers overlying the substrate and adjacent to the first end and the second end of the control gate region.

2. The device according to claim 1, wherein said first and second dielectric layers comprise oxide.

3. The device according to claim 1, wherein said substrate comprises silicon.

4. The device according to claim 1, wherein said conductive layer comprises polysilicon.

5. The device according to claim 1, further comprising:
    lightly doped regions in said substrate; and
    source and drain regions in said substrate.

6. The device according to claim 5, further comprising a silicide layer on said control gate region, said source region, and said drain region.

7. The device according to claim 1, wherein said spacers comprise oxide or nitride.

8. The device according to claim 1, wherein said electronic-trapping layer comprises silicon nitride or silicon nanoclusters.

9. The device according to claim 1, wherein said electronic-trapping region comprises a floating gate.

10. A split gate for a flash device comprising:
    a substrate;
    an electronic-trapping region comprising an electronic-trapping layer overlying a first dielectric layer;
    source/drain regions on opposing sides of the electronic-trapping region, the source/drain regions being laterally offset away from the electronic-trapping region, the first dielectric layer and the electronic-trapping layer being coextensive along an axis substantially parallel to a direction of current flow between the source/drain regions;
    a control gate region comprising a conductive layer wherein a first part of said control gate region overlies said electronic-trapping region with a second dielectric layer therebetween, the conductive layer comprising a single continuous layer, wherein a second part and a third part of said control gate region do not overlie said electronic-trapping region but do overlie said substrate with the second dielectric layer therebetween, the first part being between the second part and third part, and wherein said substrate has a substantially planar surface below the control gate region; and
    spacers overlying the substrate and adjacent to opposing ends of the control gate region.

11. The device according to claim 10, wherein said substrate comprises silicon.

12. The device according to claim 10, wherein said conductive layer comprises polysilicon.

13. The device according to claim 10, further comprising: lightly doped regions in said substrate.

14. The device according to claim 13, further comprising a silicide layer on said control gate region, said source region, and said drain region.

15. The device according to claim 10, wherein said spacers comprise oxide or nitride.

16. The device according to claim 10, wherein said electronic-trapping layer comprises silicon nitride, polysilicon, silicon nanoclusters, or a combination thereof.

17. The device according to claim 10, wherein said electronic-trapping region comprises a floating gate.

18. A split gate for a flash device comprising:
    a substrate;
    an electronic-trapping region comprising an electronic-trapping layer overlying a first dielectric layer;
    a control gate region comprising a conductive layer wherein a first part of said control gate region overlies said electronic-trapping region with a second dielectric layer therebetween, wherein a second part and a third part of said control gate region do not overlie said electronic-trapping region but do overlie said substrate with the second dielectric layer therebetween, the first part being between the second part and third part, and wherein said substrate has a substantially planar surface below the control gate region;
    spacers overlying the substrate and adjacent to opposing ends of the control gate region; and
    source/drain regions in the substrate on opposing sides of the electronic-trapping region, the source/drain regions being laterally offset away from the electronic-trapping region;
    wherein the first dielectric layer and the electronic-trapping layer is coextensive along the direction of current flow between the source/drain regions.

19. The device according to claim 18, further comprising a silicide layer on said control gate region, said source region, and said drain region.

20. The device according to claim 18, wherein said electronic-trapping layer comprises silicon nitride, polysilicon, silicon nanoclusters, or a combination thereof.

* * * * *